United States Patent
Hakey et al.

(10) Patent No.: US 8,284,017 B2
(45) Date of Patent: Oct. 9, 2012

(54) STRUCTURE HAVING SUBSTANTIALLY PARALLEL RESISTOR MATERIAL LENGTHS

(75) Inventors: Mark C. Hakey, Fairfax, VT (US); Stephen E. Luce, Underhill, VT (US); James S. Nakos, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/283,328

(22) Filed: Oct. 27, 2011

(65) Prior Publication Data
US 2012/0042298 A1 Feb. 16, 2012

Related U.S. Application Data

(62) Division of application No. 12/046,643, filed on Mar. 12, 2008, now Pat. No. 8,111,129.

(51) Int. Cl.
*H01C 1/012* (2006.01)
(52) U.S. Cl. ......... 338/311; 338/334; 257/327; 438/249
(58) Field of Classification Search ............... 338/311, 338/333, 334; 257/327, 329, 330, 369; 714/727, 714/741, 724; 438/249, 270, 392, 525
See application file for complete search history.

(56) References Cited

U.S. PATENT DOCUMENTS

| | | | |
|---|---|---|---|
| 5,043,295 A | 8/1991 | Ruggerio et al. | |
| 5,352,923 A | 10/1994 | Boyd et al. | |
| 6,069,398 A | 5/2000 | Kadosh et al. | |
| 6,096,598 A * | 8/2000 | Furukawa et al. | 438/249 |
| 6,114,251 A | 9/2000 | Nguyen et al. | |
| 6,426,268 B1 | 7/2002 | Huppert et al. | |
| 6,935,016 B2 | 8/2005 | Hashimoto et al. | |
| 6,943,405 B2 | 9/2005 | Bryant et al. | |
| 7,213,327 B2 | 5/2007 | Su et al. | |
| 7,613,235 B2 * | 11/2009 | Bar-El et al. | 375/222 |
| 2005/0097416 A1 * | 5/2005 | Plunkett | 714/727 |
| 2006/0080628 A1 * | 4/2006 | Enomoto et al. | 716/8 |
| 2007/0085164 A1 | 4/2007 | Wise et al. | |

OTHER PUBLICATIONS

Lee, Kyung S., U.S. Appl. No. 12/046,643, Notice of Allowance and Fees Due, BUR920070217US1, Sep. 30, 2011, 5 pages.
Lee, Kyung S., U.S. Appl. No. 12/046,643, Final Office Action, BUR920070217US1, Aug. 24, 2011, 9 pages.
Lee, Kyung S., U.S. Appl. No. 12/046,643, Office Action, BUR920070217US1, Jan. 7, 2011, 9 pages.
Lee, Kyung S., U.S. Appl. No. 12/046,647, Notice of Allowance and Fees Due, BUR920070238US1, Jun. 17, 2011, 7 pages.
Lee, Kyung S., U.S. Appl. No. 12/046,647, Office Action, BUR920070238US1, Jan. 7, 2011, 8 pages.

* cited by examiner

*Primary Examiner* — Kyung Lee
(74) *Attorney, Agent, or Firm* — Hoffman Warnick LLC; Anthony J. Canale

(57) ABSTRACT

A design structure including a pair of substantially parallel resistor material lengths separated by a first dielectric are disclosed. The resistor material lengths have a sub-lithographic dimension and may be spacer shaped.

14 Claims, 4 Drawing Sheets

US 8,284,017 B2

STRUCTURE HAVING SUBSTANTIALLY PARALLEL RESISTOR MATERIAL LENGTHS

This application is a divisional of co-pending U.S. patent application Ser. No. 12/046,643, filed on 12 Mar. 2008, which is incorporated herein by reference in its entirety for all that it contains in order to provide continuity of disclosure. Further, this application is related to U.S. Ser. No. 12/046,647, filed 12 Mar. 2008.

BACKGROUND

1. Technical Field

The disclosure relates generally to integrated circuit (IC) chips, and more particularly, to resistors for IC chips.

2. Background Art

In the integrated circuit (IC) chip fabrication industry, high resistivity value resistors are required. Typically, these resistors are formed by providing a thin layer of resistor material that is dimensioned to a particular length and width for a fixed thickness, which provides a known resistive value. FIG. 1A shows a top view and FIG. 1B shows a cross-sectional view of an illustrative resistor 10 having a length defined by a number of lengths L1 and a number of lengths L2 and a width W. Contacts 12 electrically couple resistor 10 to other circuitry (not shown). In order to provide the high resistive values, one approach enlarges (e.g., lengthens) the resistor. That is, the larger the number of squares (i.e., length/width) of the resistor, the higher the resistivity. Unfortunately, enlarging the size of any structure in an IC chip presents a barrier to further miniaturization of IC chips. Resistor 10 has an approximate resistive value defined in squares as $(6L1+5L2)/W1$, with a total resistance of $(6L1+5L2)/W1*Rs$, where Rs is the sheet resistance of the resistive material layer and L1 and L2 are much greater than W1.

Another conventional approach to attaining higher resistivity values is to change the material to a more resistive material. Unfortunately, currently used more resistive materials may change from metallic resistive property to more like a ceramic, semi-conductive property as the dimensions of the material go below current lithographic standards (e.g., approximately 50 nanometers). Use of sub-lithographic structures is required for continued scaling to new technology nodes. Hence, continued use of current materials, while attaining higher resistivity values is desirable.

SUMMARY

A design structure including a pair of substantially parallel resistor material lengths separated by a first dielectric are disclosed. The resistor material lengths have a sub-lithographic dimension and may be spacer shaped.

A first aspect of the disclosure provides a design structure embodied in a machine readable medium for designing, manufacturing, or testing an integrated circuit, the design structure comprising: a resistor including a pair of substantially parallel resistor material lengths separated by a first dielectric.

A second aspect of the disclosure provides a design structure embodied in a machine readable medium for designing, manufacturing, or testing an integrated circuit, the design structure comprising: a resistor including a resistor material length positioned along a sidewall of a trench structure, the resistor material length having a spacer shape and a sub-lithographic thickness.

The illustrative aspects of the present disclosure are designed to solve the problems herein described and/or other problems not discussed.

BRIEF DESCRIPTION OF THE DRAWINGS

These and other features of this disclosure will be more readily understood from the following detailed description of the various aspects of the disclosure taken in conjunction with the accompanying drawings that depict various embodiments of the disclosure, in which.

It is noted that the drawings of the disclosure are not to scale. The drawings are intended to depict only typical aspects of the disclosure, and therefore should not be considered as limiting the scope of the disclosure. In the drawings, like numbering represents like elements between the drawings.

DETAILED DESCRIPTION

Figure 1A:
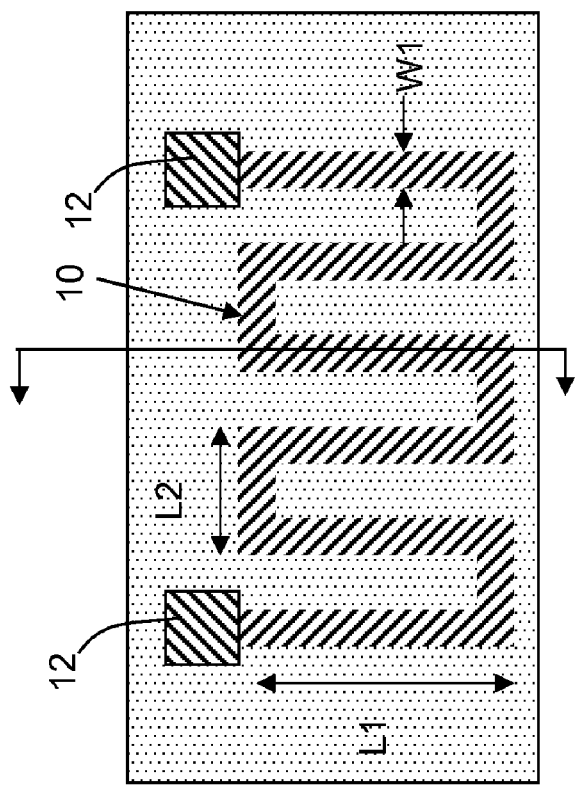
FIGS. 1A-1B show a conventional resistor.
Figure 1B:
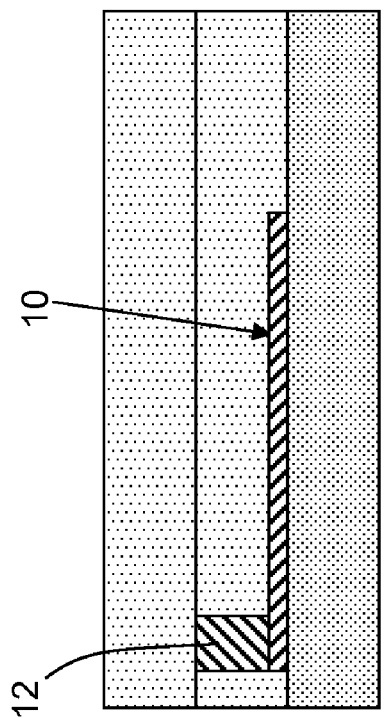
Figure 2B:
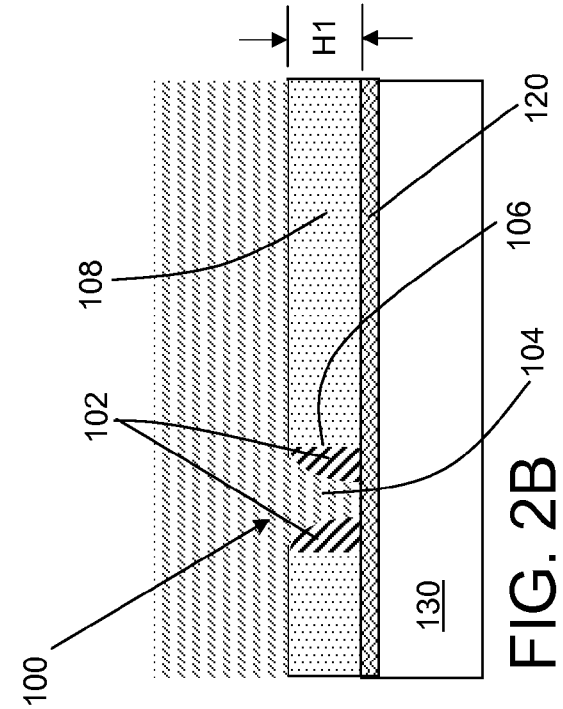
FIGS. 2A-C show embodiments of a resistor according to the disclosure, with FIG. 2D showing an intermediate processing stage.
Figure 2D:
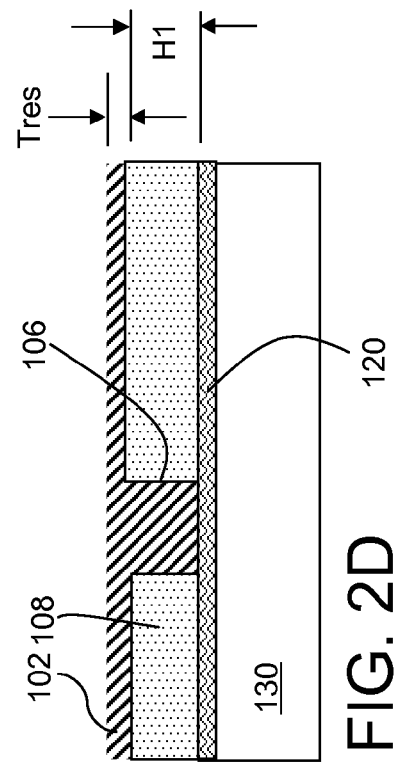
Figure 2A:
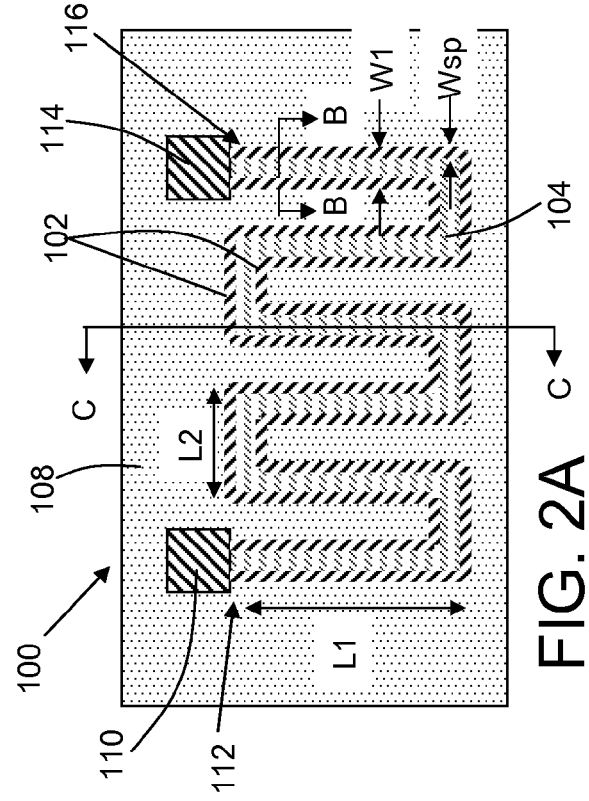
Figure 2C:
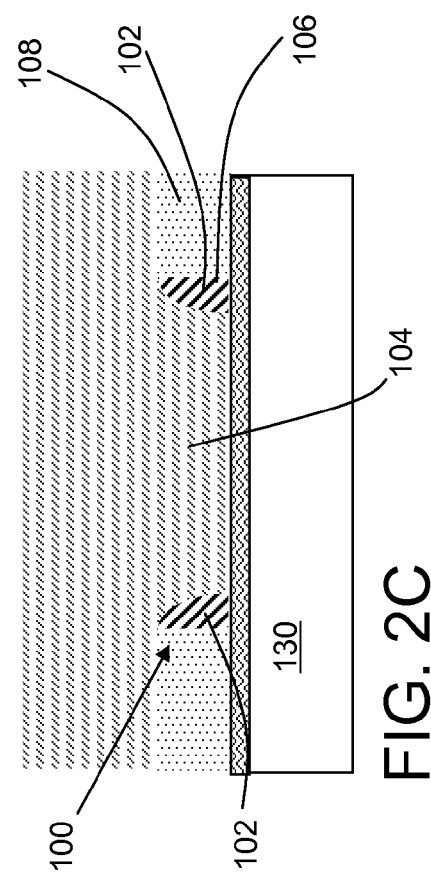

FIGS. 2A-2C show embodiments of a resistor 100 according to the disclosure. FIG. 2A shows a top view, FIG. 2B shows a cross-sectional view along line BB in FIG. 2A and FIG. 2C shows a cross-sectional view along line CC in FIG. 2A. Resistor 100 includes a pair of substantially parallel resistor material lengths 102 separated by a first dielectric 104. As shown in FIGS. 2B-2C, each resistor material length 102 is positioned adjacent to a sidewall of a trench 106 in a second dielectric 108. In addition, each resistor material length 102 may have a spacer shape, i.e., it is rounded as by etching rather than having a squared profile, and each resistor material length 102 may have a sub-lithographic dimension, e.g., width Wsp is less than current lithographic standards W1 (approximately 50 nanometers). In one embodiment, resistor material lengths 102 each have a height H1 greater than width W1 thereof. Pair of substantially parallel resistor material lengths 102 may have a serpentine layout; however, they may also be laid out in any now known or later developed manner. Resistor 100 may also include a first contact 110 coupled to a first end 112 of each resistor material length 102, and a second contact 114 coupled to a second end 116 of each of resistor material length 102. As shown in FIG. 2B, an etch stop layer 120 may be positioned under resistor material lengths 102.

Resistor 100 may be formed by providing a substrate 130 (which may include any prior levels known to those with skill in the art). Dielectric layer 108 of thickness H1 is then deposited. In an alternative embodiment, etch stop layer 120 (e.g., silicon nitride ($Si_3N_4$) may be deposited prior to dielectric layer 108. Dielectric layer 108 may include but is not limited to: silicon nitride ($Si_3N_4$), silicon oxide ($SiO_2$), fluorinated $SiO_2$ (FSG), hydrogenated silicon oxycarbide (SiCOH), porous SiCOH, boro-phospho-silicate glass (BPSG), silsesquioxanes, carbon (C) doped oxides (i.e., organosilicates) that include atoms of silicon (Si), carbon (C), oxygen (O), and/or hydrogen (H), thermosetting polyarylene ethers, SiLK (a polyarylene ether available from Dow Chemical Corporation), JSR (a spin-on silicon-carbon contained polymer material available form JSR Corporation), other low dielectric constant (<3.9) material, or layers thereof. "Depositing" may include any now known or later developed techniques appropriate for the material to be deposited including but are not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

Figure 3B:
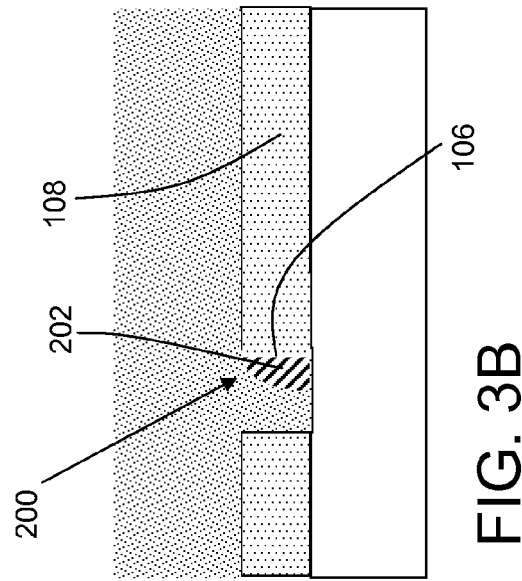
FIGS. 3A-C show another embodiment of a resistor according to the disclosure.
Figure 3C:
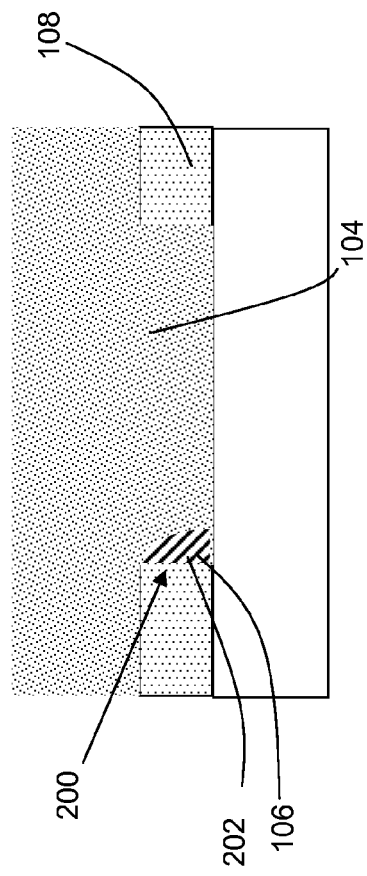
Figure 3A:
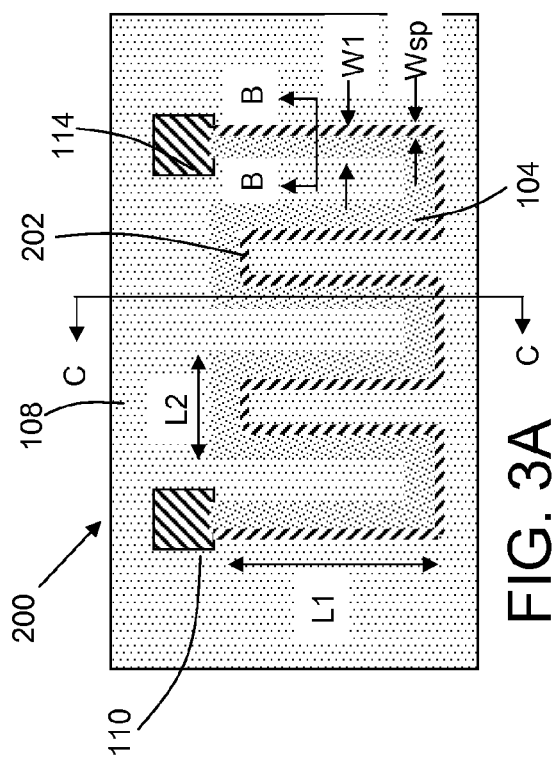

Trench 106 is then formed in dielectric layer 108 using any now known or later developed techniques, e.g., depositing, patterning and etching a photoresist, and then etching dielectric layer 108. Trench 106 has the general layout of resistor material lengths 102. Etching proceeds to substrate 130 or to etch stop layer 120, where provided. Thus, dielectric layer 108 is etched forming trench 106 of height H1. As shown in FIG. 2D, resistor material is then deposited in trench 106, resulting in resistor material having a thickness Tres which will define the resistor width Wsp. Resistor material may include, but is not limited to: tantalum nitride ($TaN_x$), aluminum nitride ($AlN_x$), gallium nitride ($GaN_x$), etc. Next, the resistor material is etched forming resistor material lengths 102 shaped like spacers along a sidewall of trench 106 in dielectric layer 108. Resistor material lengths 102 thus have a sub-lithographic width Wsp and height H1. In an alternative embodiment, another mask (not shown) may be employed and one of resistor material lengths 102 (FIGS. 2A-C) may be removed, as shown in FIG. 3A-C, resulting in a resistor 200 including only a single resistor material length 202. FIG. 3A shows a top view, FIG. 3B shows a cross-sectional view along line BB in FIG. 3A and FIG. 3C shows a cross-sectional view along line CC in FIG. 3A.

Once resistor material lengths 102, 202 are formed, another dielectric layer 104 is then deposited, filling the space between (or adjacent to if only one) resistor material lengths 102. In one embodiment, dielectric layer 104 may include similar material as those listed for dielectric layer 108. In another embodiment, as shown in FIGS. 3A-C, dielectric 104 and 108 may be different materials. Conventional processing to form contacts 110, 114 may then be provided.

A resistance value of resistor 100, 200 is defined by a height of a step (defined by dielectric 108 height H1) and the thickness of the deposited resistor material Tres, not the lithographic width W1. As an analogy to the prior art, the trench height H1 is analogous to the line width, the length for the current embodiment is similar to that of the prior art as is the resistor thickness. It may be noted that the resistor thickness may not be totally conformal in which case the deposition is adjusted to match the thickness for the prior art to the trench sidewall. For the illustrative resistor 100 shown, the resistance value in squares for the leftmost starting part $R1=(2*L1+4(L1-T_w)+3*L2+2*(L2-T_w))/H1$, where $T_w$ is trench width is equal to W1 in FIG. 2A, and which simplifies to $(6L1+5L2-6T_w)/H1$; and for the other part of resistor 100 $R2=(6*(L1-T_w)+2*L2+3*(L2-T_w))/H1$, which simplifies to $(6L-5L2-9T_w)/H1$. The total resistance $R_t$ can be calculated according to $1/R_t=1/R1+1/R2$. For the illustrative resistor 200 in FIG. 3A, the resistance value is squares is simply that of R1 (since the illustrated portion corresponds to the leftmost starting part of resistor 100 of FIG. 2A). Resistor 100 has an effective width H1 that is less than a minimum photolithographic dimension W1 so that an increase in resistance per unit area can be realized resulting in a resistor with a higher resistance in less area than conventional resistors. As such, length does not have to be increased and other non-conventional resistor material may be avoided. Resistor 100, 200 may be contacted from above and/or below levels.

Resistor 100, 200 (FIGS. 2A-C, 3A-C) as described above is part of the design for an integrated circuit chip. The chip design is created in a graphical computer programming language, and coded as a set of instructions on machine readable removable or hard media (e.g., residing on a graphical design system (GDS) storage medium). That is, design structure 190 (FIG. 4) (i.e., resistor 100, 200 (FIGS. 2A-C, 3A-C)) is embodied in a machine readable medium used in a design process.

Figure 4:
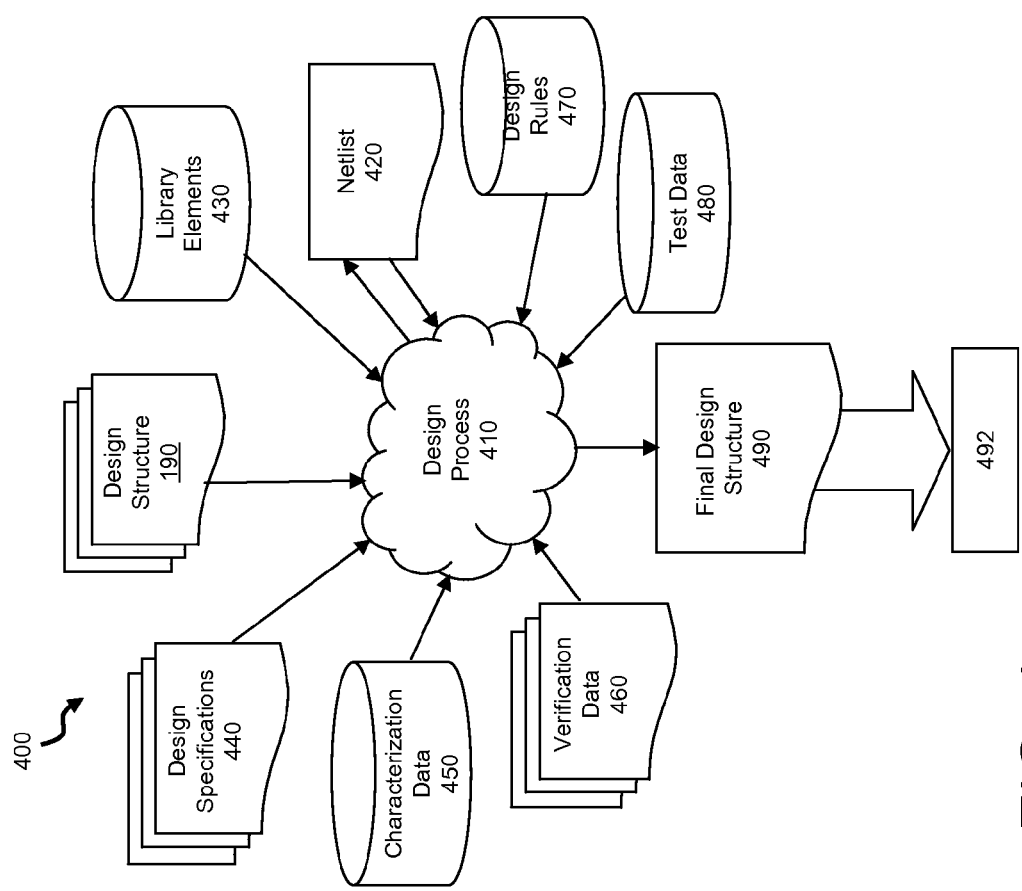
FIG. 4 shows a flow diagram of a design process used in semiconductor design, manufacture, and/or test.

FIG. 4 shows a block diagram of an example design flow 400. Design flow 400 may vary depending on the type of integrated circuit (IC) being designed. For example, a design flow 400 for building an application specific IC (ASIC) will differ from a design flow 400 for designing a standard component. Design structure 190 is an input to a design process 410 and may come from an IP provider, a core developer, or other design company. Design structure 190 comprises resistor 100, 200 (FIGS. 2A-C, 3A-C) in the form of schematics or a hardware-description language (HDL) (e.g., Verilog, VHDL, C, etc.). For example, design structure 190 may be a text file or a graphical representation of resistor 100, 200 (FIGS. 2A-C, 3A-C). Design process 410 synthesizes (or translates) resistor 100, 200 (FIGS. 2A-C, 3A-C) into a netlist 420, where netlist 420 is, for example, a list of interconnects, transistors, logic gates, control circuits, I/O, models, etc. and describes the connections to other elements and circuits in an integrated circuit design and recorded on at least one machine readable medium.

Design process 410 includes using a variety of inputs; for example, inputs from library elements 430 which may house a set of commonly used elements, circuits, and devices, including models, layouts, and symbolic representations, for a given manufacturing technology (e.g., different technology nodes, 32 nm, 45 nm, 40 nm, etc.), design specifications 440, characterization data 450, verification data 460, design rules 470, and test data files 480, which may include test patterns and other testing information. Design process 410 further includes, for example, standard circuit design processes such as timing analysis, verification tools, design rule checkers, place and route tools, etc. One of ordinary skill in the art of integrated circuit design can appreciate the extent of possible electronic design automation tools and applications used in design process 410 without deviating from the scope and spirit of the disclosure.

Ultimately, design process 410 translates resistor 100, 200 (FIGS. 2A-C, 3A-C), along with the rest of the integrated circuit design (if applicable), into a final design structure 490 (e.g., information stored in a GDS storage medium). Final design structure 490 may comprise information such as, for example, test data files, design content files, manufacturing data, layout parameters, interconnects, levels of metal, vias, shapes, test data, data for routing through the manufacturing line, and any other data required by a semiconductor manufacturer to produce resistor 100, 200 (FIGS. 2A-C, 3A-C). Final design structure 490 may then proceed to a stage 492 of design flow 400, where stage 492 is, for example, where final design structure 490 proceeds to tape-out, is released to manufacturing, is sent to another design house or is sent back to the customer.

The methods, resistors and design structure as described above are used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A design structure embodied in a machine readable medium for designing, manufacturing, or testing an integrated circuit, the design structure comprising:
    a resistor including a pair of substantially parallel resistor material lengths separated by a first dielectric and positioned adjacent to a sidewall of a trench in a second dielectric,
    wherein each of the pair of substantially parallel resistor material lengths has a serpentine layout;
    a first contact coupled to a first end of each of the pair of substantially parallel resistor material lengths; and
    a second contact coupled to a second end of each of the pair of substantially parallel resistor material lengths.

2. The design structure of claim 1, wherein the design structure comprises a netlist.

3. The design structure of claim 1, wherein the design structure resides on storage medium as a data format used for the exchange of layout data of integrated circuits.

4. The design structure of claim 1, wherein the design structure includes at least one of test data, characterization data, verification data, or design specifications.

5. The design structure of claim 1, wherein the resistor material lengths each have a height greater than a width thereof.

6. The design structure of claim 1, further comprising an etch stop layer under the resistor material.

7. The design structure of claim 1, wherein each resistor material length has a spacer shape.

8. The design structure of claim 1, wherein each resistor material length has a sub-lithographic dimension.

9. A design structure embodied in a machine readable medium for designing, manufacturing, or testing an integrated circuit, the design structure comprising:
    a resistor including a resistor material length positioned along a sidewall of a trench structure, the resistor material length having a spacer shape and a sub-lithographic thickness,
    wherein the resistor material length includes a pair of substantially parallel resistor material lengths;
    a first contact coupled to a first end of each of the pair of substantially parallel resistor material lengths; and
    a second contact coupled to a second end of each of the pair of substantially parallel resistor material lengths.

10. The design structure of claim 9, wherein the design structure comprises a netlist.

11. The design structure of claim 9, wherein the design structure resides on storage medium as a data format used for the exchange of layout data of integrated circuits.

12. The design structure of claim 9, wherein the design structure includes at least one of test data, characterization data, verification data, or design specifications.

13. The design structure of claim 9, wherein the resistor material length has a height greater than a width thereof.

14. The design structure of claim 9, further comprising an etch stop layer under the resistor material.

* * * * *